(12) United States Patent
Kawakami

(10) Patent No.: US 6,483,132 B2
(45) Date of Patent: Nov. 19, 2002

(54) CHARGE COUPLED DEVICE WITH SEPARATE ISOLATION REGION

(75) Inventor: Yukiya Kawakami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/825,936

(22) Filed: Apr. 5, 2001

(65) Prior Publication Data

US 2001/0035539 A1 Nov. 1, 2001

(30) Foreign Application Priority Data

Apr. 6, 2000 (JP) ........................................ 2000-104442

(51) Int. Cl.[7] ...................... H01L 29/768; H01L 27/148
(52) U.S. Cl. ........................................ 257/224; 257/223
(58) Field of Search ......................... 257/220, 222–224, 257/241

(56) References Cited

U.S. PATENT DOCUMENTS

| 4,012,758 | A | * | 3/1977 | Esser | .......................... 257/220 |
| 4,613,895 | A | * | 9/1986 | Burkey et al. | ............... 257/241 |
| 4,814,848 | A | * | 3/1989 | Akimoto et al. | ............. 257/223 |
| 5,233,429 | A | * | 8/1993 | Jung | ........................... 257/220 |
| 5,962,882 | A | * | 10/1999 | Sin | ............................. 257/223 |
| 6,369,414 | B2 | * | 4/2002 | Kawakami | .................. 257/224 |

* cited by examiner

Primary Examiner—Gene M. Munson
(74) Attorney, Agent, or Firm—Sughrue Mion, PLLC

(57) ABSTRACT

A charge coupled device including: a substrate; a semiconductor layer overlying the substrate; a semiconductor layer overlying the semiconductor layer; a charge storage layer existing on the semiconductor layer and sandwiched by a pair of isolation regions; an impurity region between the semiconductor layer and the charge storage layer; a dielectric film overlying the charge storage layer and the isolation regions, and an electrode formed by a conductive film. In accordance with the present invention, the increase of the amount of the charge storage and of the higher photosensitivity can be simultaneously satisfied. The fluctuation of the characteristics of the charge coupled device in accordance with the present invention is smaller than that of the conventional charge coupled device. Further, the method of the fabrication is less complicated than that for the conventional charge coupled device.

4 Claims, 17 Drawing Sheets

EFFECTIVE PHOTOELECTRIC
CONVERSION REGION

EFFECTIVE PHOTOELECTRIC
CONVERSION REGION

EFFECTIVE PHOTOELECTRIC CONVERSION REGION

CHARGE COUPLED DEVICE WITH SEPARATE ISOLATION REGION

BACKGROUND OF THE INVENTION (a) Field of the Invention

The present invention relates to a charge coupled device (CCD) used for a solid state imaging device, and a method for fabricating the same.

(b) Description of the Related Art

A cell or a pixel of a frame-transfer CCD (FTCCD) used for an image sensor includes a sectional structure, a P-type impurity region 23 diffused at a higher temperature is formed on a N-type semiconductor substrate 11. An N-type charge storage layer 13 sandwiched between a pair of isolation regions 12 is formed on the P-type layer 23, and a plurality of electrodes formed by a conductive film 15 are arranged in a one-dimensional array on the charge storage layer 13 with an intervention of a dielectric film 14 therebetween.

In the conventional FTCCD, signal charge obtained by photoelectric conversion and stored in a charge storage layer is transferred by applying a specified driving voltage to the electrodes through the dielectric film 14. Excess signal charge is discharged to a substrate by applying a specified voltage to the substrate, thereby preventing noise caused by the signal charge flowing to an adjacent cell. By applying pulse voltages to the substrate under the above situation, electrons are discharged to the substrate for controlling the amount of the stored charge, thereby conducting exposure control referred to as a substrate shutter or electron shutter.

Generally, in the solid state imaging device, the increase of the amount of the stored charge per cell or pixel is required for a higher dynamic range in addition to the higher photosensitivity of the pixel. In order to increase the amount of the stored charge, a technique has been developed in which the charge storage layer including a heavily doped and a lightly doped region underlying the heavily doped region, the technique being referred to as "Profiled Peristaltic CCD (PPCCD). The technique is described by J. T. Bosiers et. al., in the advanced publication of "Design Options for ¼"—FTCCD pixels, 1995 IEEE Workshop on Charge-Coupled Devices and Advanced Image Sensors (April, 1995)". As shown in FIGS. 2A and 2B, an N-type (heavily doped) impurity layer 24 is present on the top of the N-type (lightly doped) charge storage layer 13 in the PPCCD.

The PPCCD structure may be used for increasing the amount of the stored charge in the charge coupled device, wherein a shallower ion injection technique is used for increasing the impurity density of the top surface of the charge storage layer. However, the impurity distribution, similar to the Gauss distribution, formed by the ion implantation fluctuates the amount of the injection to provide non-uniform characteristics if the peak portion of the implantation varies in the thickness direction due to the different thicknesses of the dielectric film covering the charge storage layer 13 for preventing the contamination with heavy metal.

A problem exists also in the higher sensitivity range of the CCD. The effective photoelectric conversion region is restricted by the potential peak generated in a P-type semiconductor region when the signal charge is an electron as exemplified in a conventional FTCCD shown in FIG. 3 and in a conventional PPCCD shown in FIG. 4. The signal charge generated by the photoelectric conversion at the area deeper than the potential peak flows to the substrate and is not utilized.

The deepening of the p-type semiconductor region for simply extending the effective photoelectric conversion region increases the potential for forming the depletion area (i.e. depletion potential) in the CCD, due to the deepening of the potential of the charge storage section. Accordingly, a power source voltage should be increased.

As shown in FIG. 5, the impurity distribution effective for deepening the potential peak intended to suppress the increase of the depletion potential of the CCD may be achieved by a P$^-$ layer or an almost intrinsic layer existing in the area between a surface N-type layer and a P-type layer in the substrate. However, the formation of the uniform almost-intrinsic region is impossible in the practical fabrication process, and the mass-production is impossible due to the lower yield.

SUMMARY OF THE INVENTION

In view of the foregoing, an object of the present invention is to provide a charge coupled device which is capable of satisfying the increase of a stored charge amount and a higher photosensitivity.

The present invention provides, in a first aspect thereof, a charge coupled device including: a substrate having a first conductivity type; a first semiconductor layer having a second conductivity type and formed on the substrate; a second semiconductor layer having the first conductivity type formed on the first semiconductor layer; a charge storage layer having the first conductivity type formed on the second semiconductor layer and sandwiched by a pair of isolation regions; an impurity region having the second conductivity type and disposed between the second semiconductor layer and the charge storage layer; a dielectric film formed on the charge storage layer and the isolation regions, and a plurality of electrodes arranged in a one-dimensional array on the dielectric film.

The present invention provides, in a second aspect thereof, a method for fabricating a charge coupled device including the steps of: forming a first mask pattern overlying a substrate having a first conductivity type; implanting, by using the first mask pattern, impurities having a second conductivity type into the substrate to form a first type-conductivity layer in the top part of the substrate and a second type-conductivity layer in the bottom part of the substrate; forming a second mask pattern overlying the substrate; implanting, by using the second mask pattern, impurities having the first conductivity type into the substrate to form a charge storage layer in the surface of the substrate; forming a third mask pattern overlying the substrate; implanting, by using the third mask pattern, impurities having the second conductivity type into the substrate to form an isolation region; forming a fourth mask pattern having an opening narrower than an opening of the second mask pattern; and implanting, by using the fourth mask pattern, impurities having the second conductivity type into the substrate to form an impurity region having the second conductivity type in the bottom part of the charge storage layer.

In accordance with the present invention, the increase of the amount of the charge storage and of the higher photosensitivity can be simultaneously satisfied. The fluctuation of the characteristics of the charge coupled device in accordance with the present invention is smaller than that of the conventional charge coupled device. Further, the method of the fabrication is less complicated than that for the conventional charge coupled device.

The above and other objects, features and advantages of the present invention will be more apparent from the following description.

PREFERRED EMBODIMENTS OF THE INVENTION

At first, principles of the present invention will be described for a purpose of clear understanding.

A possible method for increasing the density of the charge storage layer of the PPCCD and reducing the internal density includes the steps of initially increasing the whole density and injecting impurities of the opposite conductivity into the interior of the layer. Thereby, the internal density is reduced to obtain specified impurities distribution. The deepening of the impurities peak almost removes the fluctuation of the total dosage due to the change of the peak location compared with the shallower impurities peak.

In connection with the effective photoelectric conversion region, the formation of the depleted region having a gentle potential slope in the CCD suppresses the increase of the depleted potential of the CCD to deepen the potential peak. When the effective photoelectric conversion region is formed with a single impurities region, the nearly intrinsic impurities distribution is required. In place of the single impurities region, a stacked structure may be used for easily realizing the deepened potential peak including a plurality of P-type and N-type regions having an impurities density higher than that of the substrate. Then the potential monotonously becomes shallower with respect to the depth from the charge storage region having the deeper potential to the peak part of the P-type layer having the shallower potential though the change of the potential slope or the secondary differential coefficient of the potential with respect to the depth may be positive (P-type region) or negative (N-type region).

Figure 1A:
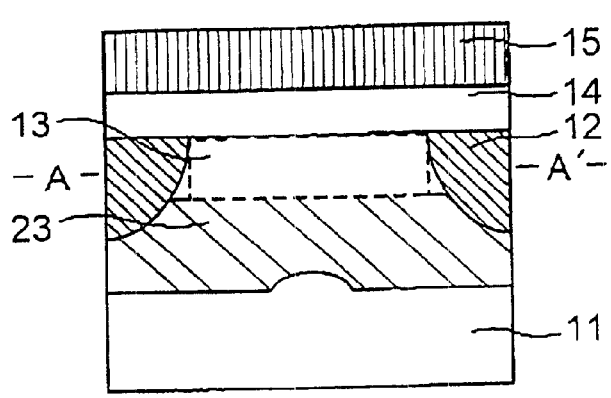
FIG. 1A is a vertical sectional view showing a conventional FTCCD single cell.
Figure 1B:
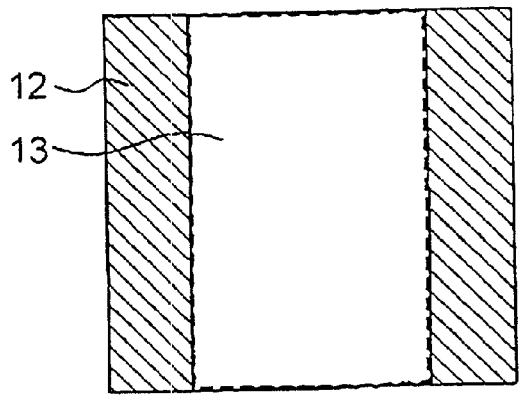
FIG. 1B is a horizontal sectional view taken along a line A–A' in FIG. 1A.
Figure 2A:
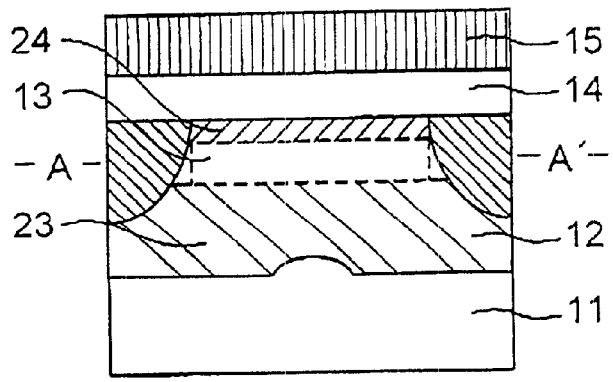
FIG. 2A is a vertical sectional view showing a conventional PPCCD single cell.
Figure 2B:
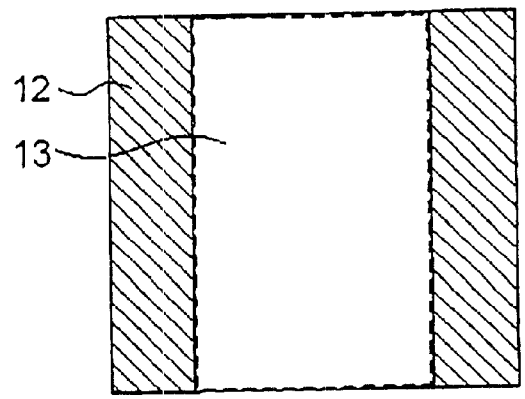
FIG. 2B is a horizontal sectional view taken along a line A–A' in FIG. 2A.
Figure 3:
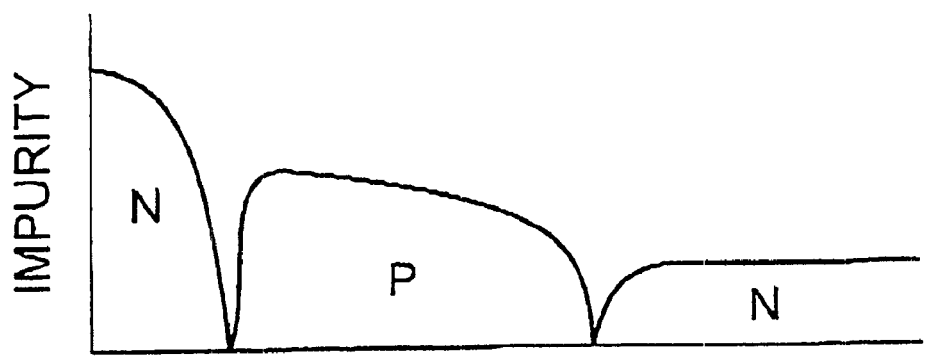
FIG. 3 is a graph showing impurities distribution and a relation between potential distribution and an effective photoelectric conversion region in the FTCCD.
Figure 3:
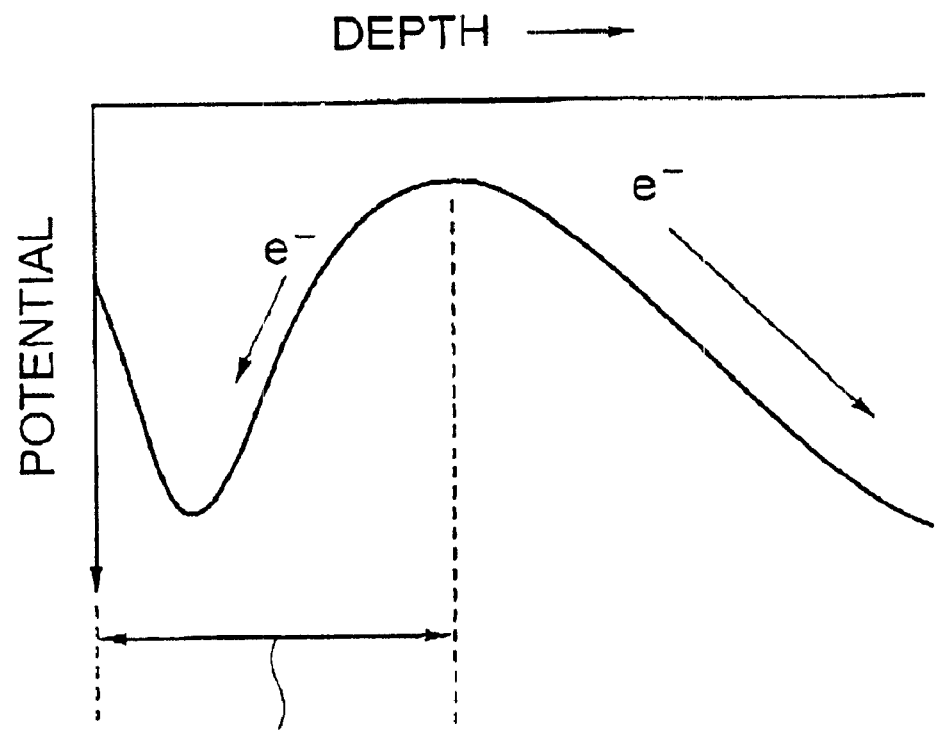
Figure 4:
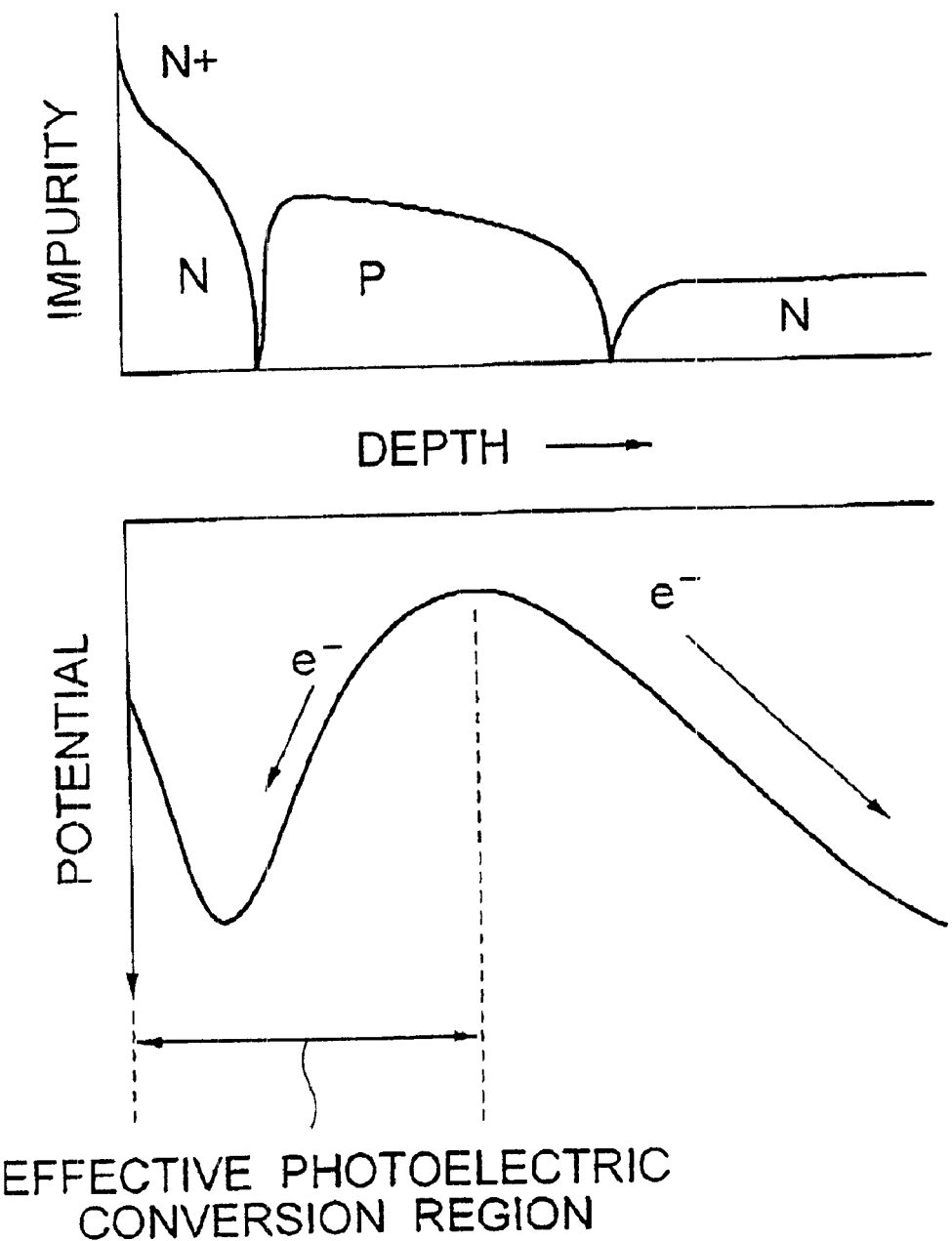
FIG. 4 is a graph showing impurities distribution and a relation between potential distribution and an effective photoelectric conversion region in the PPCCD.
Figure 5:
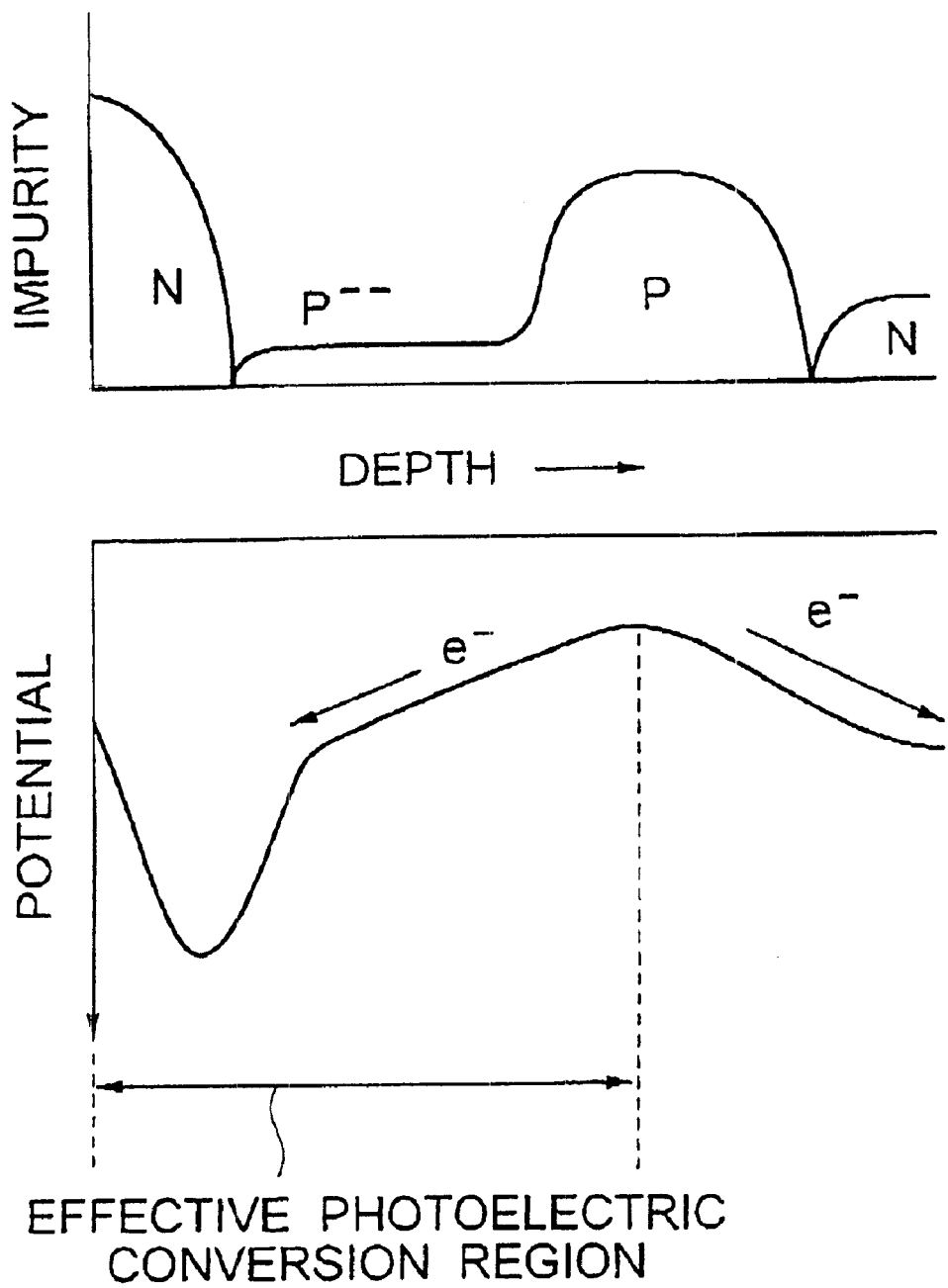
FIG. 5 is a graph showing impurities distribution and a relation between potential distribution and an effective photoelectric conversion region in the PPCCD having higher photosensitivity based on the principle.
Figure 32:
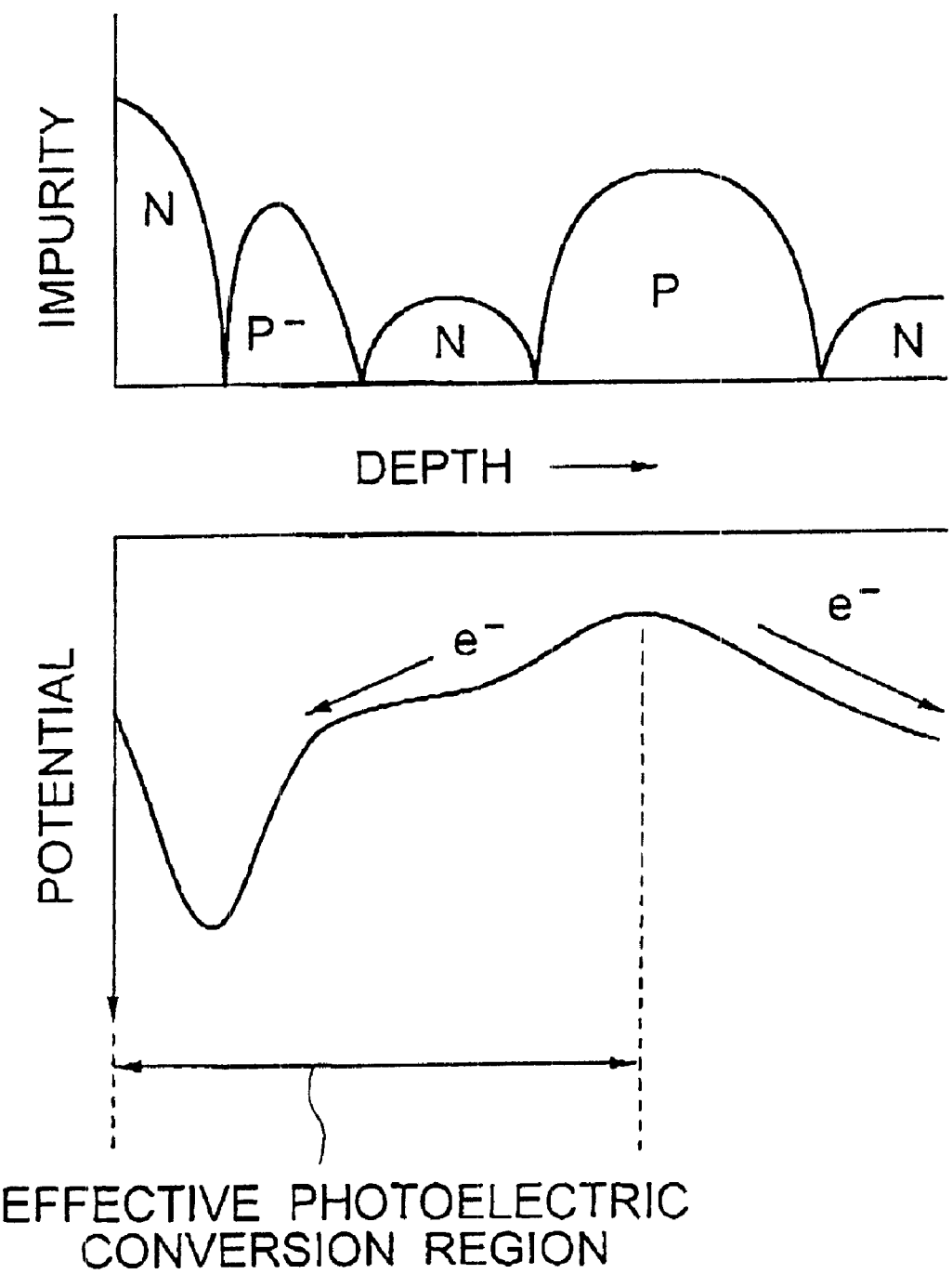
FIG. 32 is a graph showing impurities distribution and a relation between potential distribution and an effective photoelectric conversion region in PPCCD having higher photosensitivity and formed by an N-type layer, a P-type layer, an N-type layer, a P-type layer and an N-type layer.

Accordingly, the ion implantation of P-type impurities may be conducted such that a P-type semiconductor region is formed deeper in the charge storage region near to the substrate. In other words, the conventional distribution including the N-type, the P-type, the P-type and the N-type shown in FIG. 5 may be converted into another distribution including an N-type, a P-type, an N-type (substrate density), a P-type and an N-type shown in FIG. 32.

Figure 33:
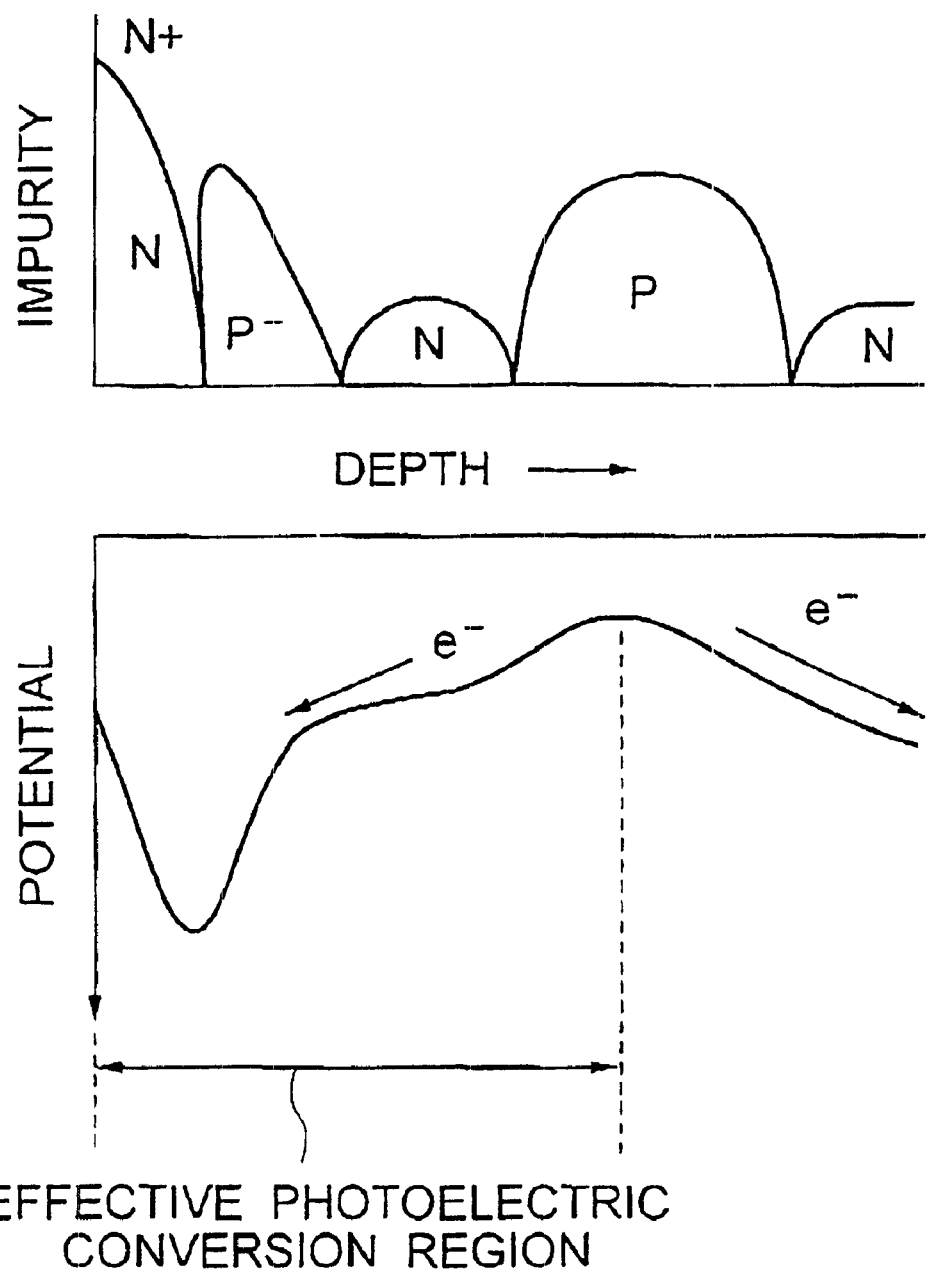
FIG. 33 is a graph showing impurities distribution and a relation between potential distribution and an effective photoelectric conversion region in CCD having higher charge storage and higher photosensitivity in accordance with present invention.

When the N-type impurities are implanted at a higher density followed by the P-type impurity implantation such that depth of the impurity peak of the P-type impurities is deeper than that of the N-type impurities in the PPCCD having the N-type charge storage layer, the PPCCD may be configured as shown in FIG. 33 to simultaneously increase the amount of the charge storage and the effective photoelectric conversion region.

If the open region of the mask pattern for the ion implantation of the P-type impurities is narrower than that for the N-type charge storage layer, the N-type impurities density around the edge of the charge storage layer is higher and that around the center of one is lower to suppress the narrower-channel characteristic; thereby increasing the amount of the charge storage Now, the present invention is more specifically described with reference to accompanying drawings.

Figure 6A:
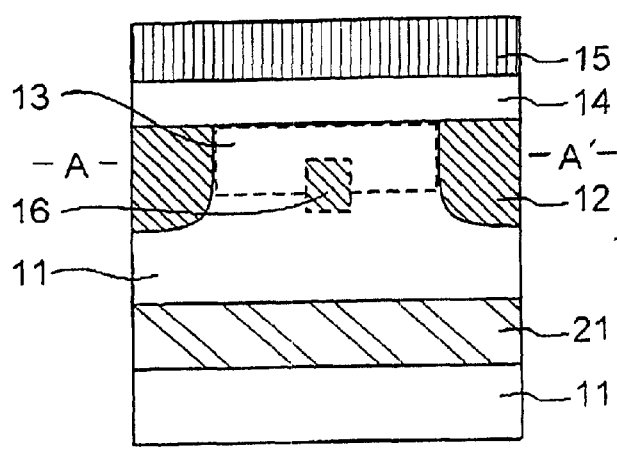
FIG. 6A is a vertical sectional view showing a single cell of a charge coupled device in accordance with a first embodiment of the present invention.
Figure 6B:
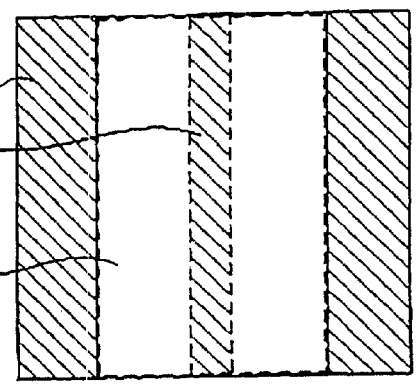
FIG. 6B is a horizontal sectional view taken along a line A–A' in FIG. 6A.

As shown in FIGS. 6A and 6B, a charge coupled device in accordance with a first embodiment of the present invention includes a P-type semiconductor layer 21 buried in an N-type semiconductor substrate 11, and an N-type charge storage layer 13 sandwiched by a pair of P-type isolation regions 12 deposited on the top surface of the N-type semiconductor substrate 11. A dielectric film 14 and an electrode formed by a conductive film 15 are formed on the charge storage layer 13. In the bottom of the charge storage layer 13, a striped P-type impurity region 16 is buried partially entering into the charge storage layer 13.

Figure 7A:
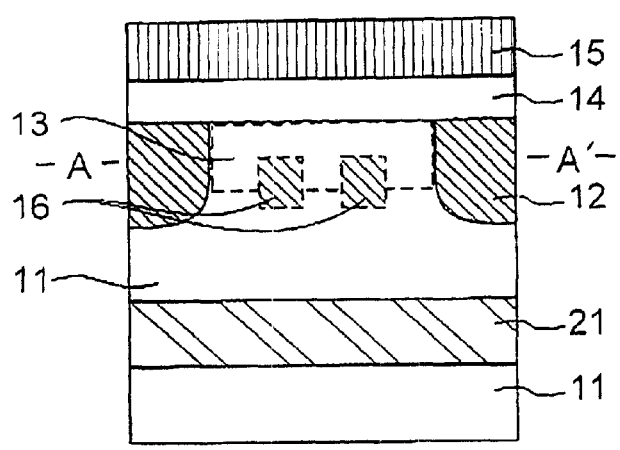
FIG. 7A is a vertical sectional view showing a single cell of a charge coupled device in accordance with a second embodiment.
Figure 7B:
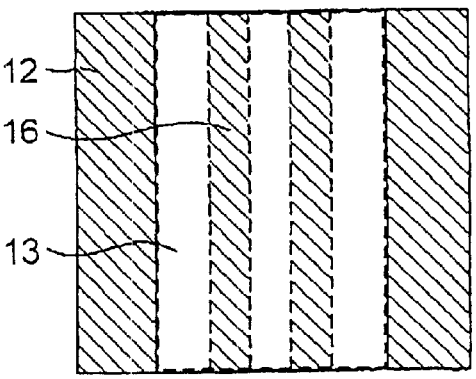
FIG. 7B is a horizontal sectional view taken along a line A–A' in FIG. 7A.

As shown in FIGS. 7A and 7B, a charge coupled device in accordance with a second embodiment of the present invention includes substantially same configuration as that of the first embodiment except that a pair of the striped P-type impurity regions 16 are formed. In the configuration, the amount of the stored charges can be increased and the increase of the pulse voltage of the substrate shutter can be suppressed even in the charge coupled device having a relatively large cell size and a weaker two-dimensional effect Although the localized P-type impurity region includes the striped shape in the first and second embodiments, these are examples and do not restrict the present invention.

Figure 8A:
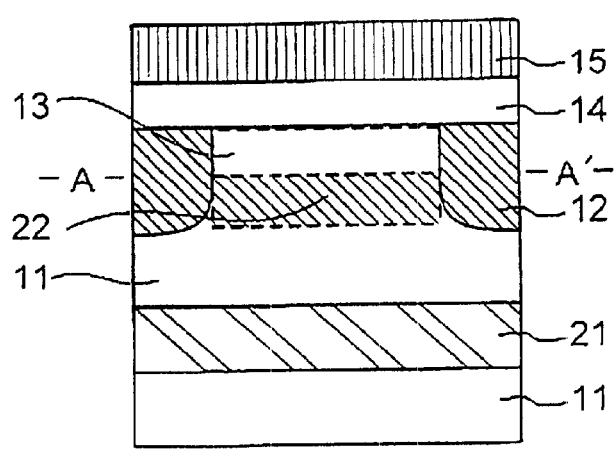
FIG. 8A is a vertical sectional view showing a single cell of a charge coupled device in accordance with a third embodiment.
Figure 8B:
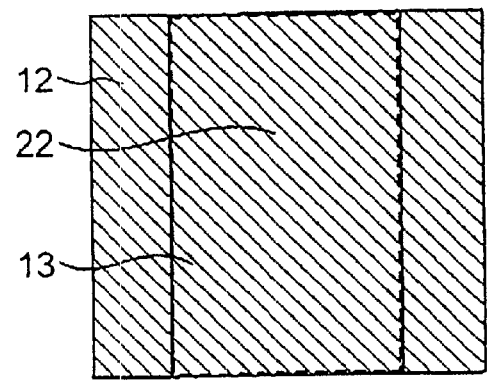
FIG. 8B is a horizontal sectional view taken along a line A–A' in FIG. 8A.

As shown in FIGS. 8A and 8B, a charge coupled device in accordance with a third embodiment of the present invention includes substantially same configuration as that of the first embodiment except that a P-type impurity region 22 is formed on the entire bottom surface of the charge storage layer 13 and in contact with the adjacent isolation regions 12. In the configuration, the charge storage layer 13 and the impurity region 22 can be simultaneously formed with a single mask pattern.

Then, a method for fabricating the charged coupled device of the embodiments will be described referring to annexed drawings. FIGS. 9 to 17 show the method for fabricating the charged coupled device of the first embodiment.

Figure 9:
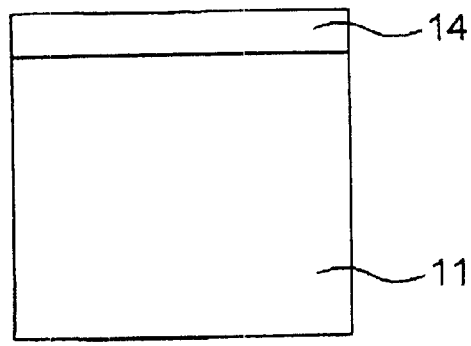
FIGS. 9 to 17 are vertical sectional views sequentially showing a method for fabricating the charge coupled device of the first embodiment.
Figure 10:
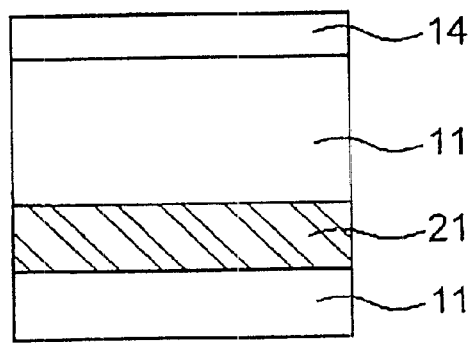
Figure 11:
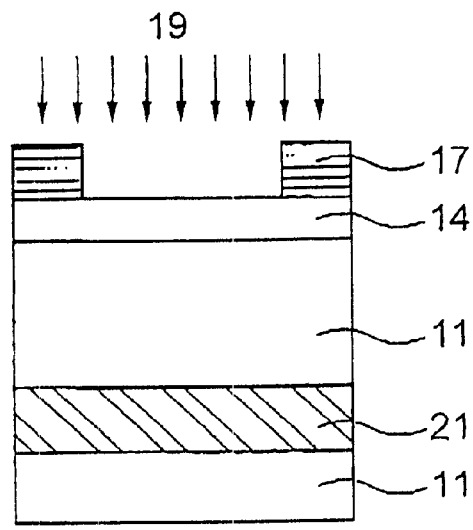
Figure 12:
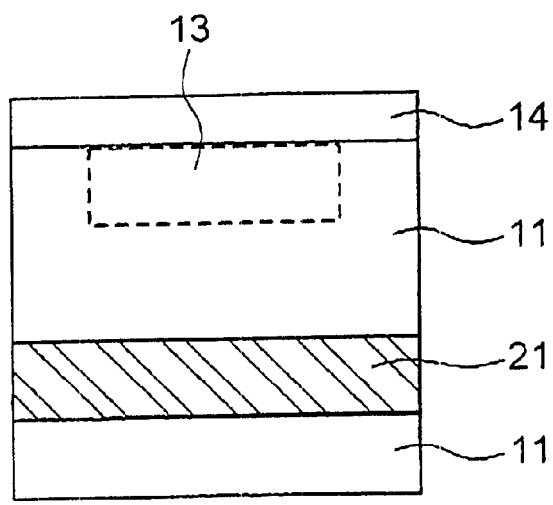

As shown in FIG. 9, P-type impurities 25 are implanted in the entire cell surface including the dielectric film 14 to form the P-type semiconductor layer 21 buried in the N-type semiconductor substrate 11 (FIG.10). After the formation and the exposure of photoresist 17, N-type impurities 19 for forming the charge storage layer are implanted by using the photoresist 17 as a mask as shown in FIG. 11, thereby forming the N-type charge storage layer 13 as shown in FIG. 12.

Figure 13:
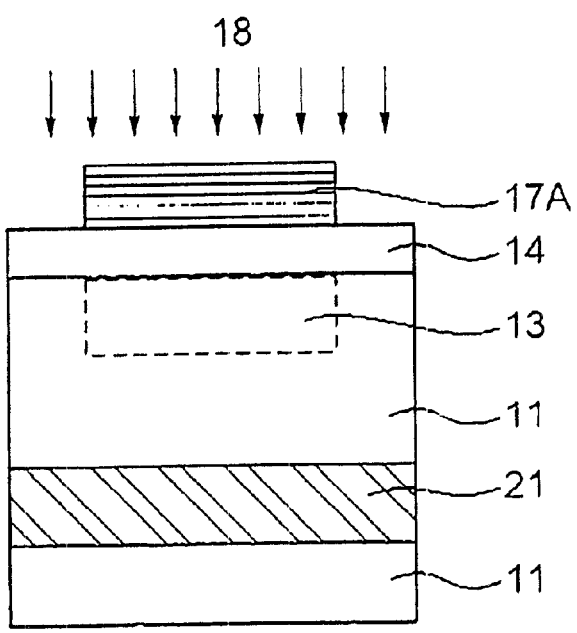
Figure 14:
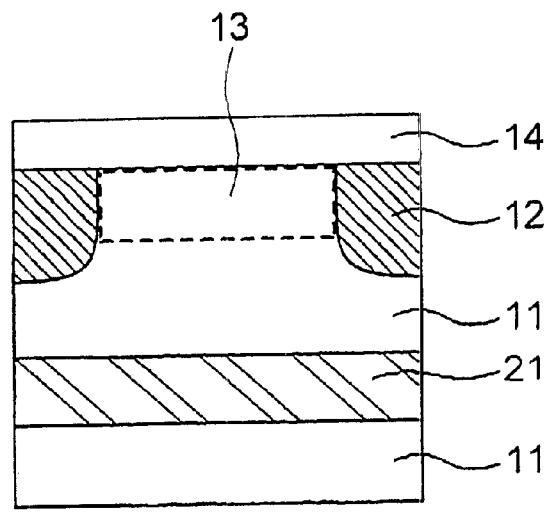

After another photoresist 17A is formed and exposed, P-type impurities 18 for forming the isolation regions are implanted by using the photoresist 17A as a mask, as shown in FIG. 13, thereby forming the isolation regions 12, as shown in FIG. 14.

Figure 15:
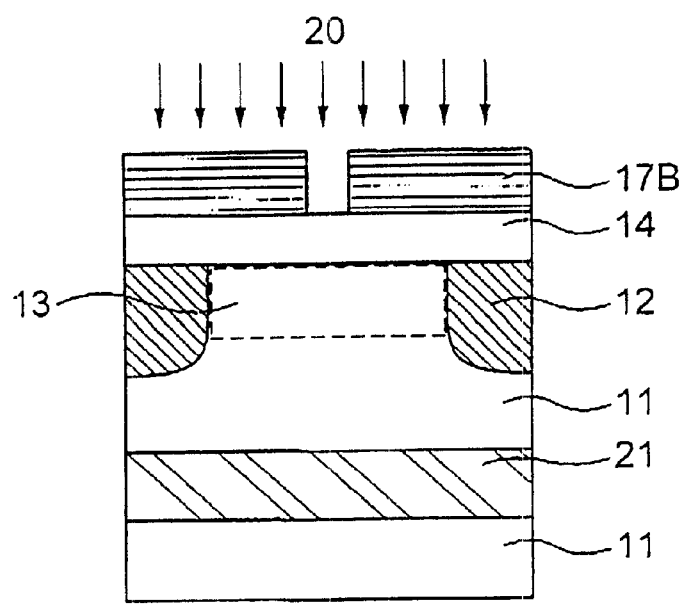
Figure 16:
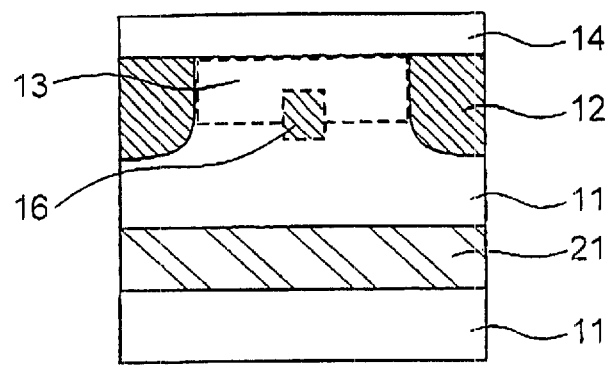
Figure 17:
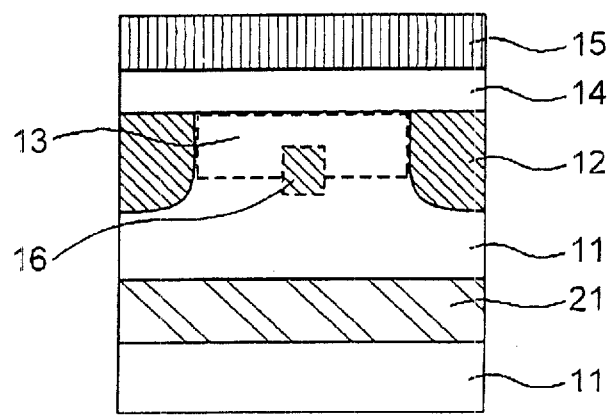

After further photoresist 17B is formed and exposed, P-type impurities 20 for forming the localized P-type impurity region are implanted by using the photoresist 17B as a mask, as shown in FIG. 15, thereby forming the P-type impurity region 16, as shown in FIG. 16 After the removal of the photoresist, the electrode formed by the conductive film 15 is mounted on the pixel to provide the charge coupled device of the first embodiment, as shown in FIG. 17.

By modifying the exposing pattern of the photoresist in FIG. 15, the charge coupled device of the second embodiment can be obtained. In the above procedures, the order of the first successive steps shown in FIGS. 9 and 10, the second successive steps shown in FIGS. 11 and 12, and the third successive steps shown in FIGS. 13 and 14 may be changed without deteriorating the essence of the present invention.

Then, a method for fabricating the charge coupled device of the second embodiment will be described referring to FIGS. 18 to 21.

Figure 18:
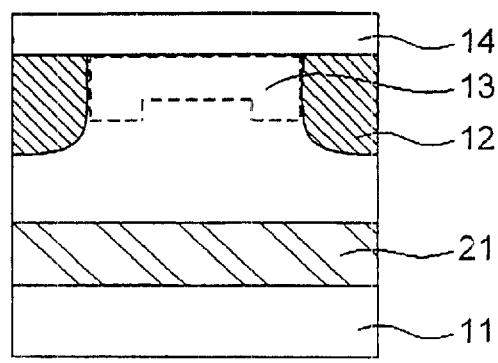
FIGS. 18 to 21 are vertical sectional views sequentially showing a method for fabricating the charge coupled device of the second embodiment.
Figure 19:
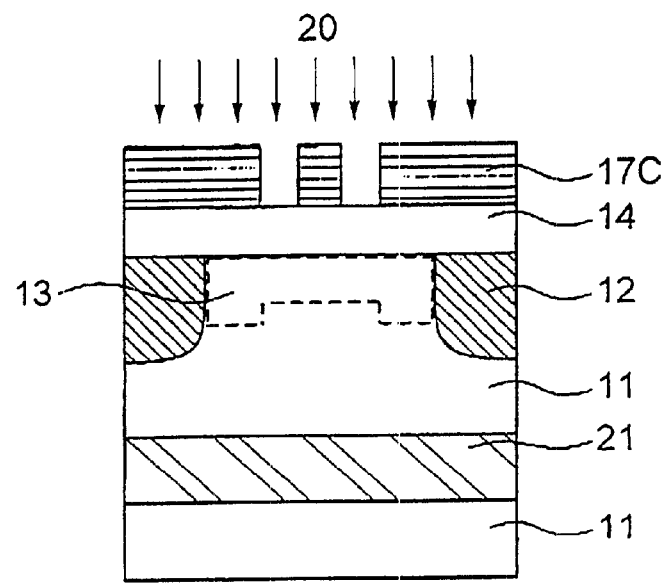
Figure 20:
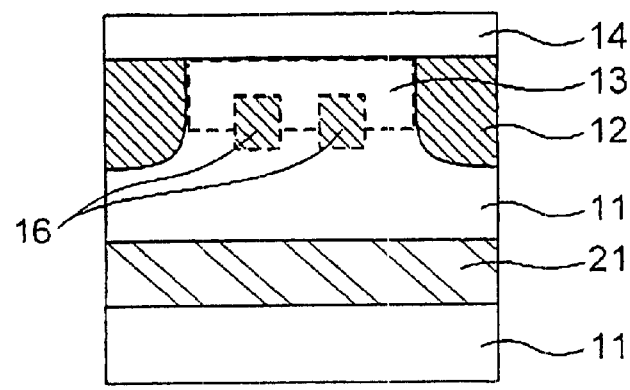
Figure 21:
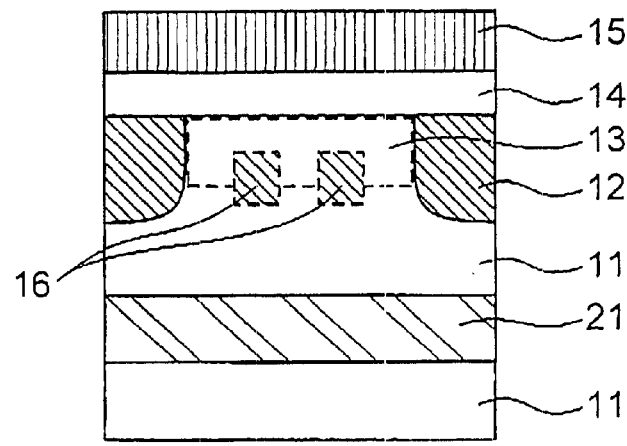

After the procedures shown in FIGS. 9 to 15 are conducted to form a stacked structure of FIG. 18, P-type impurities 20 for forming the localized P-type impurity region are implanted by using a photoresist 17C having a pair of groves as a mask, as shown in FIG. 19, thereby forming the P-type impurity region 16, as shown in FIG. 20. After the removal of the photoresist, the electrode formed by the conductive film 15 is mounted on the pixel to provide the charge coupled device of the second embodiment, as shown in FIG. 21.

In the above procedures, the order of the first successive steps shown in FIGS. 9 and 10 described in connection with the first embodiment, the second successive steps shown in FIGS. 11 and 12 described in connection with the first embodiment, and the third successive steps shown in FIGS. 19 and 20 may be changed without deteriorating the essence of the present invention.

Then, another method for fabricating the charge coupled device of the second embodiment will be described referring to FIGS. 22 to 26.

Figure 22:
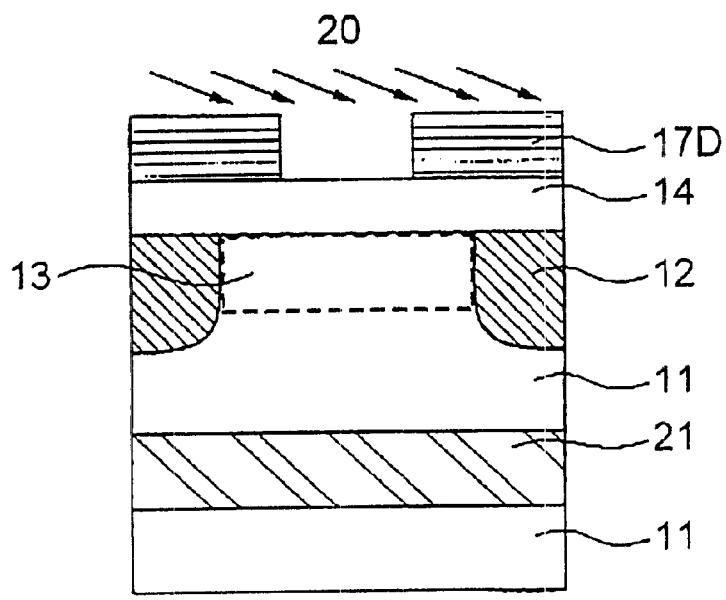
FIGS. 22 to 26 are vertical sectional views sequentially showing another method for fabricating the charge coupled device of the second embodiment.
Figure 23:
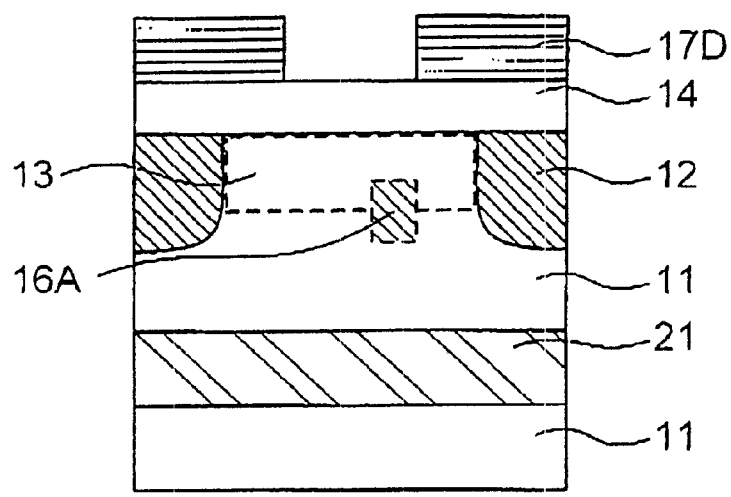
Figure 24:
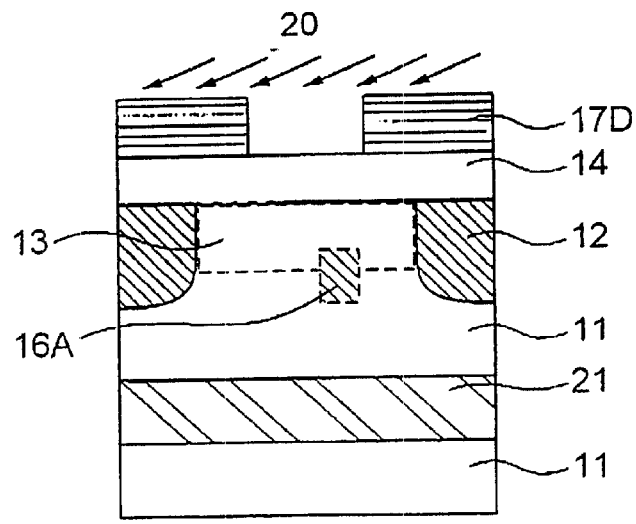
Figure 25:
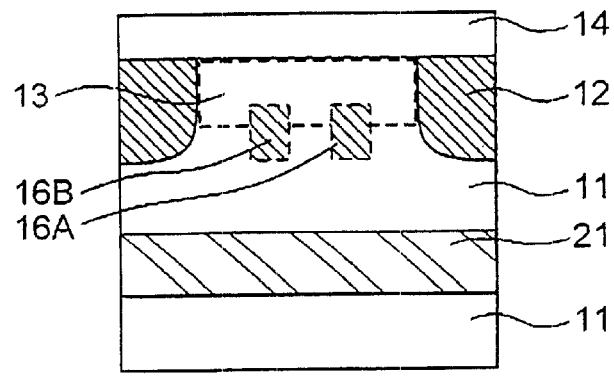

After the procedures shown in FIGS. 9 to 14 are conducted to form the stacked structure having the photoresist shown in FIG. 22, P-type impurities 20 for forming the localized P-type impurity region are diagonally implanted from left to right by using a photoresist 17D having a wider groove as a mask, thereby forming the single P-type impurity region 16A in the right-hand section of the interface between the charge is storage layer 13 and the substrate 11, as shown in FIG. 23. Then, the P-type impurities 20 are diagonally implanted from right to left by using the photoresist 17D as a mask, as shown in FIG. 24, thereby forming the P-type impurity region 16B in the left-hand section, as shown in FIG. 25.

Figure 26:
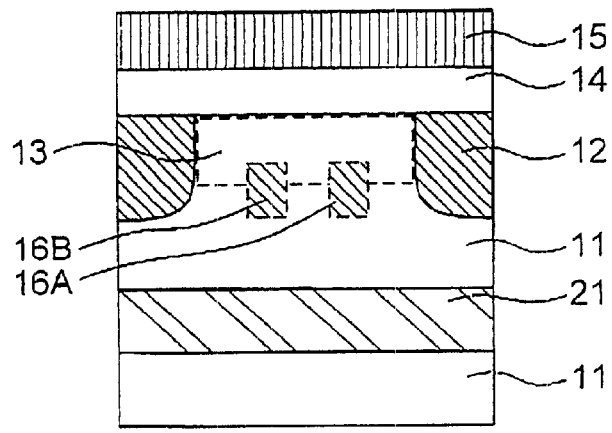

After the removal of the photoresist, the electrode formed by the conductive film 15 is mounted on the pixel to provide the charge coupled device of the second embodiment, as shown in FIG. 26.

Also in the above procedures, the order of the three successive steps may be changed without deteriorating the essence of the present invention.

Then, a method for fabricating the charge coupled device of the third embodiment will be described referring to FIGS. 27 to 31.

Figure 27:
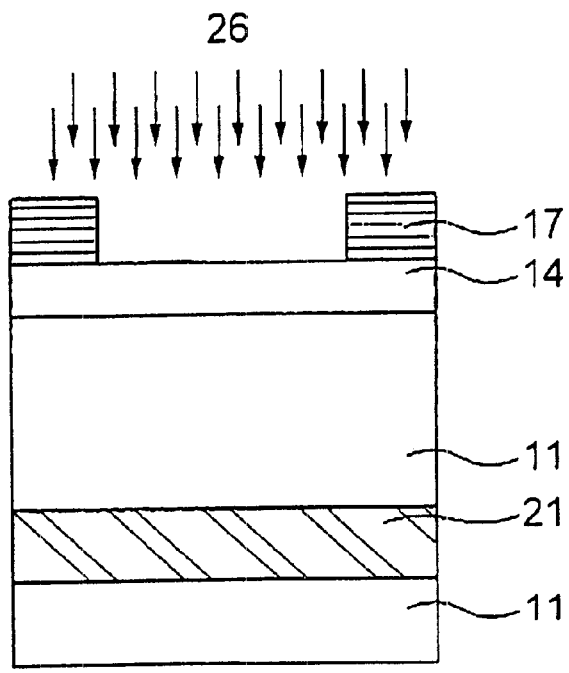
FIGS. 27 to 31 are vertical sectional views sequentially showing another method for fabricating the charge coupled device of the third embodiment.
Figure 28:
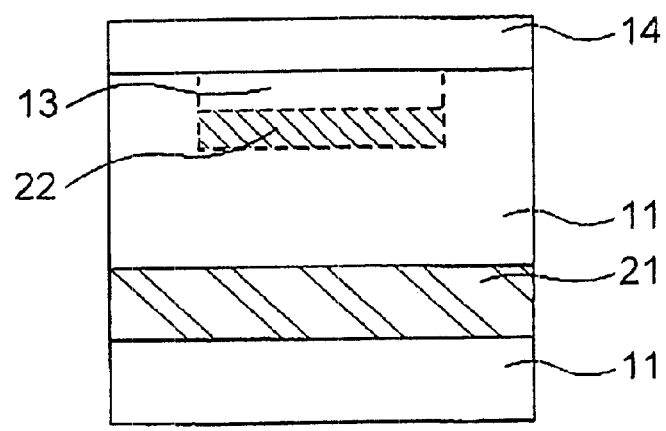

After the procedures shown in FIGS. 9 and 10 are conducted to form the stacked structure having the photoresist shown in FIG. 27, N-type and P-type impurities are separately implanted by using the photoresist as a mask, thereby forming the N-type charge storage layer 13 and the P-type charge storage region 22 as shown in FIG. 28.

Figure 29:
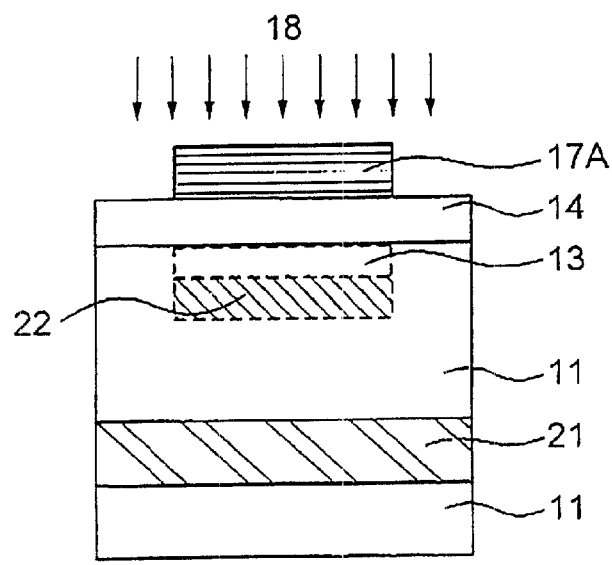
Figure 30:
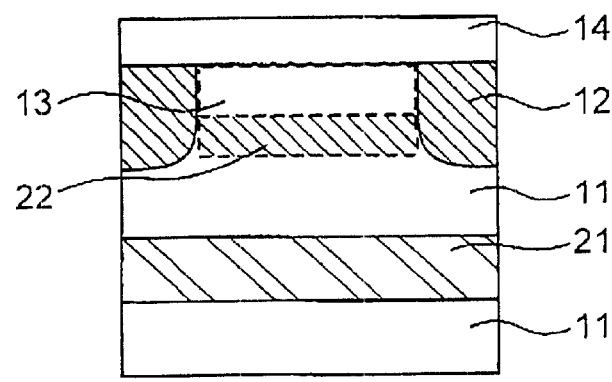

After another photoresist 17A is formed and exposed, P-type impurities 18 for forming the isolation regions are implanted by using the photoresist 17A as a mask, as shown in FIG. 29, thereby forming the isolation regions 12, as shown in FIG. 30.

Figure 31:
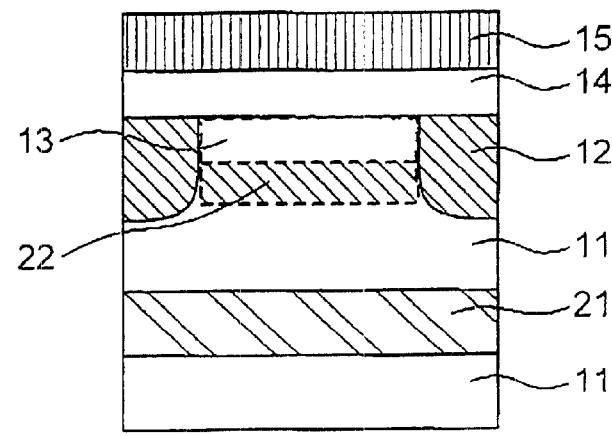

After the removal of the photoresist, the electrode formed by the conductive film 15 is mounted on the pixel to provide the charge coupled device of the third embodiment, as shown in FIG. 31.

Also in the above procedures, the order of the three successive steps may be changed without deteriorating the essence of the present invention.

Since the above embodiments are described only for examples, the present invention is not limited to the above embodiments and various modifications or alterations can be easily made therefrom by those skilled in the art without departing from the scope of the present invention.

What is claimed is:

1. A charge coupled device comprising:
   a substrate having a first conductivity type;
   a first semiconductor layer having a second conductivity type formed on the substrate;
   a second semiconductor layer having the first conductivity type formed on the first semiconductor layer;
   a charge storage layer having the first conductivity type formed on the second semiconductor layer and sandwiched by a pair of isolation regions;

an impurity region having the second conductivity type and disposed between the second semiconductor layer and the charge storage layer;

a dielectric film formed on the charge storage layer and the isolation regions, and a plurality of electrodes arranged in a one-dimensional array on the dielectric film;

wherein the impurity region is not in contact with the isolation regions.

2. The charge coupled device as defined in claim 1 wherein a plurality of the impurity regions are present between the second semiconductor layer and the charge storage layer.

3. The charge coupled device as defined in claim 1 wherein the impurity region has a striped shape.

4. The charge coupled device as defined in claim 1 wherein a width of the charge storage layer is not less than 5 $\mu$m.

* * * * *